(12) United States Patent
Inoue et al.

(10) Patent No.: US 7,247,903 B2
(45) Date of Patent: Jul. 24, 2007

(54) SEMICONDUCTOR MEMORY DEVICE

(75) Inventors: Ken Inoue, Tokyo (JP); Shintaro Arai, Tokyo (JP)

(73) Assignee: NEC Electronics Corporation (JP)

( * ) Notice: Subject to any disclaimer, the term of this patent is extended or adjusted under 35 U.S.C. 154(b) by 0 days.

(21) Appl. No.: 11/202,069

(22) Filed: Aug. 12, 2005

(65) Prior Publication Data
US 2005/0263812 A1 Dec. 1, 2005

Related U.S. Application Data

(62) Division of application No. 10/173,049, filed on Jun. 18, 2002, now Pat. No. 6,995,413.

(30) Foreign Application Priority Data

Jun. 22, 2001 (JP) ............................. 2001-188950

(51) Int. Cl.
*H01L 27/108* (2006.01)
*H01L 29/76* (2006.01)
*H01L 29/94* (2006.01)
*H01L 31/119* (2006.01)

(52) U.S. Cl. ............... 257/296; 257/306; 257/E21.648; 257/E21.66

(58) Field of Classification Search ................ 257/296, 257/754, 303, 306, 393, 903, 295, 377, 413, 257/E21.646, E21.648, E21.66
See application file for complete search history.

(56) References Cited

U.S. PATENT DOCUMENTS

| | | | |
|---|---|---|---|
| 5,956,594 A | 9/1999 | Yang et al. | |
| 6,022,776 A * | 2/2000 | Lien et al. | 438/253 |
| 6,028,360 A * | 2/2000 | Nakamura et al. | 257/758 |
| 6,037,215 A | 3/2000 | Lee et al. | |
| 6,051,462 A | 4/2000 | Ohno | |
| 6,103,566 A * | 8/2000 | Tamaru et al. | 438/240 |
| 6,127,231 A * | 10/2000 | Mori | 438/275 |
| 6,127,260 A | 10/2000 | Huang | |
| 6,150,214 A * | 11/2000 | Kaeriyama | 438/253 |
| 6,150,689 A * | 11/2000 | Narui et al. | 257/306 |
| 6,177,307 B1 | 1/2001 | Tu et al. | |
| 6,200,855 B1 | 3/2001 | Lee | |
| 6,274,470 B1 | 8/2001 | Ichimori et al. | |
| 6,414,375 B1 * | 7/2002 | Ohkawa | 257/637 |
| 6,417,534 B2 * | 7/2002 | Nakahata et al. | 257/306 |

(Continued)

*Primary Examiner*—B. William Baumeister
*Assistant Examiner*—Igwe U. Anya
(74) *Attorney, Agent, or Firm*—Dickstein, Shapiro, LLP.

(57) ABSTRACT

A semiconductor memory device having a transistor formed on a semiconductor substrate and a capacitor formed on the upper layer of the transistor and electrically connected to the transistor, includes: a cell contact which is formed on a first interlayer insulation film covering the transistor and is electrically connected to the transistor; a bit contact which is formed on a second interlayer insulation film provided on the first interlayer insulation film and is electrically connected to the cell contact; a bit line which is formed on the second interlayer insulation film and is connected to the bit contact; a capacitor which is formed on a third interlayer insulation film covering the bit line; a capacitor contact which is formed through the third and second interlayer insulation film and makes a connection between the capacitor and the cell contact; and a side wall which has an etching selectivity with the second and third interlayer insulation films formed on the surface of the bit line.

6 Claims, 19 Drawing Sheets

U.S. PATENT DOCUMENTS 6,461,911 B2     10/2002   Ahn et al.
6,472,754 B2 *   10/2002   Nakajima et al. ........... 257/758
6,521,955 B1 *   2/2003    Ida et al. .................... 257/382
6,690,053 B2 *   2/2004    Amo et al. ................. 257/306

* cited by examiner

SEMICONDUCTOR MEMORY DEVICE

CROSS-REFERENCE TO RELATED APPLICATION

This is a division of application Ser. No. 10/173,049, filed Jun. 18, 2002 now U.S. Pat. No. 6,995,413, which is hereby incorporated herein by reference.

BACKGROUND OF THE INVENTION

1. Field of the Invention

This invention relates to a semiconductor device, specifically a semiconductor memory device appropriately applied on a semiconductor device integrally made up of a peripheral circuit and a dynamic random memory (DRAM).

2. Description of the Prior Art

In a semiconductor device in which a peripheral circuit and a dynamic random memory (DRAM) are integrally formed on a single semiconductor device, especially a COB (Capacitor On Bit line) where the capacitor of DRAM is arranged above a bit line, there is a problem of a contact resistance that makes an electrical connection between an element and a metal wiring in a peripheral circuit. Heretofore, such a kind of the semiconductor memory device, as shown in a schematic cross sectional view thereof in FIG. 18, is prepared by the steps of: forming a memory cell transistor Tm for DRAM on a memory cell region and forming a peripheral circuit transistor Ts on a peripheral circuit (logic circuit) region on a silicon substrate 101, followed by forming a bit line 115 on an interlayer insulation film 106 of the memory cell region, and forming interlayer insulation films 110, 112 on these components, and forming a capacitor 127 for charge storage, which is comprised of a lower electrode 124, a capacitor insulation film 125, and an upper electrode 126, in a recessed portion formed in the interlayer insulation film 122. Subsequently, the bit line 115 is electrically connected to the memory cell transistor Tm through a contact 112, while the capacitor 127 is electrically connected to the memory cell transistor Tm through a contact 119. Furthermore, the capacitor 127 is covered with an interlayer insulation film 128, followed by forming a metal wiring 131 on the peripheral circuit region and electrically connecting to the peripheral circuit transistor Ts through a contact 130. In this semiconductor memory device, however, the total film thickness of the interlayer insulation films that cover the bit line 115 and the capacitor 127 in the peripheral circuit region, so that the deep contact 130 extending to the peripheral circuit transistor Ts through the thick interlayer insulation films should be formed. Such a configuration of the semiconductor memory device causes the difficulty in forming an opening hole for the contact in the interlayer insulation film, resulting in a trouble in the manufacture of the contact.

In an improved semiconductor device in the prior art, on the other hand, as shown in a cross sectional diagram of FIG. 19, each of the memory cell region and the peripheral circuit region on which the memory cell transistor Tm and the peripheral circuit transistor Ts are respectively formed is constructed by forming a contact (referred to as a cell contact) 109 in the interlayer insulation film 106 below the bit line 115 and electrically connecting the cell contact 109 to each of the transistors Tm, Ts of the respective regions. In the memory cell region, furthermore, the bit line 115 is connected to the cell contact 109, while the capacitor 127 is electrically connected to the cell contact 106 through a contact (referred to as a capacitor contact) formed in the interlayer insulation film 110 above the cell contact 106. In the peripheral circuit, a metal wiring 131 on the interlayer insulation film 128 above the capacitor 127 is electrically connected to the cell contact 109 through a contact (referred to as a metal contact) 130A. According such a configuration of the improved semiconductor device in the prior art, opening holes for the metal contact 130A may be only formed through the interlayer insulation films 128, 122, 110, respectively. Comparing with the semiconductor memory device of FIG. 18, the depth of the contact hole can be reduced, so that the process for manufacturing the contact can be simplified.

However, in such an improved semiconductor device, the upper end portion of the sell contact 109 is exposed at the surface of the interlayer insulation film 106. Thus, when the bit line 115 is formed on the upper surface of the interlayer insulation film 106, the bit line 115 may be displaced from a predetermined position as a result of a photolithographic technology. Therefore, as indicated by "X" in FIG. 19, a part of the bit line 115 interferes with the cell contact 109 to make a short circuit between the bit line 115 and the cell contact 109. Specifically, not shown in the figure, the cell contact 109 is formed by subjecting the interlayer insulation film 106 to a selective etching technology just as in the case with the typical contact hole. Thus, it can be formed in the shape of a taper such that the diameter of an upper opening is larger than the diameter of a lower opening. In other words, the upper end portion of the cell contact 109 tends to become one having a larger diameter, so that a short circuit can be easily occurred between the cell contact 109 and the bit line 115. Therefore, the restriction on pitch dimensions of the bit lines 115 may be occurred, resulting in the difficulty of highly integrated semiconductor memory device in addition to the decrease in the process yield.

Furthermore, the capacitor 127 is formed like a cylinder in the recessed portion formed in the interlayer insulation film 122 that covers the bit line 115. For increasing the capacitor, there is a need to increase the facing area between the lower electrode 124 and the upper electrode 126. In this case, if the film thickness of the interlayer insulation film 122 is increased so as to increase the dimensions of the capacitor in the film thickness direction, even though the cell contact 109 is formed, the depth of the metal contact 130A in the peripheral circuit region becomes deeper. Therefore, it becomes difficult to manufacture the contact, resulting in the decrease in the process yield. In addition, if the area of the capacitor 127 in the plane direction is increased, there is a restriction on proving the memory cell corresponding to the capacitor in high density and the production of a highly integrated semiconductor memory device becomes difficult.

BRIEF DESCRIPTION OF THE INVENTION

OBJECTS OF THE INVENTION

An object of the present invention is to provide a semiconductor memory device for allowing a high-density semiconductor memory device including DRAM as a memory cell while improving the manufacturing yield.

SUMMARY OF THE INVENTION

There is provided a semiconductor memory device having a transistor formed on a semiconductor substrate and a capacitor formed on the upper layer of the transistor and electrically connected to the transistor, comprising: a cell contact which is formed on a first interlayer insulation film covering the transistor and is electrically connected to the transistor; a bit contact which is formed on a second interlayer insulation film provided on the first interlayer insulation film and is electrically connected to the cell contact; a bit line which is formed on the second interlayer insulation film and is connected to the bit contact; a capacitor which is formed on a third interlayer insulation film covering the bit line; a capacitor contact which is formed through the third and second interlayer insulation film and makes a connection between the capacitor and the cell contact; and a side wall which has an etching selectivity with the second and third interlayer insulation films formed on the surface of the bit line.

BRIEF DESCRIPTION OF THE DRAWINGS

The above-mentioned and other objects, features, and advantages of this invention will become more apparent by reference to the following detailed description of the invention taken in conjunction with the accompanying drawings, wherein.

DETAILED DESCRIPTION OF THE INVENTION

Next, we will describe preferred embodiments of the present invention with reference to the drawings.

Figure 1:
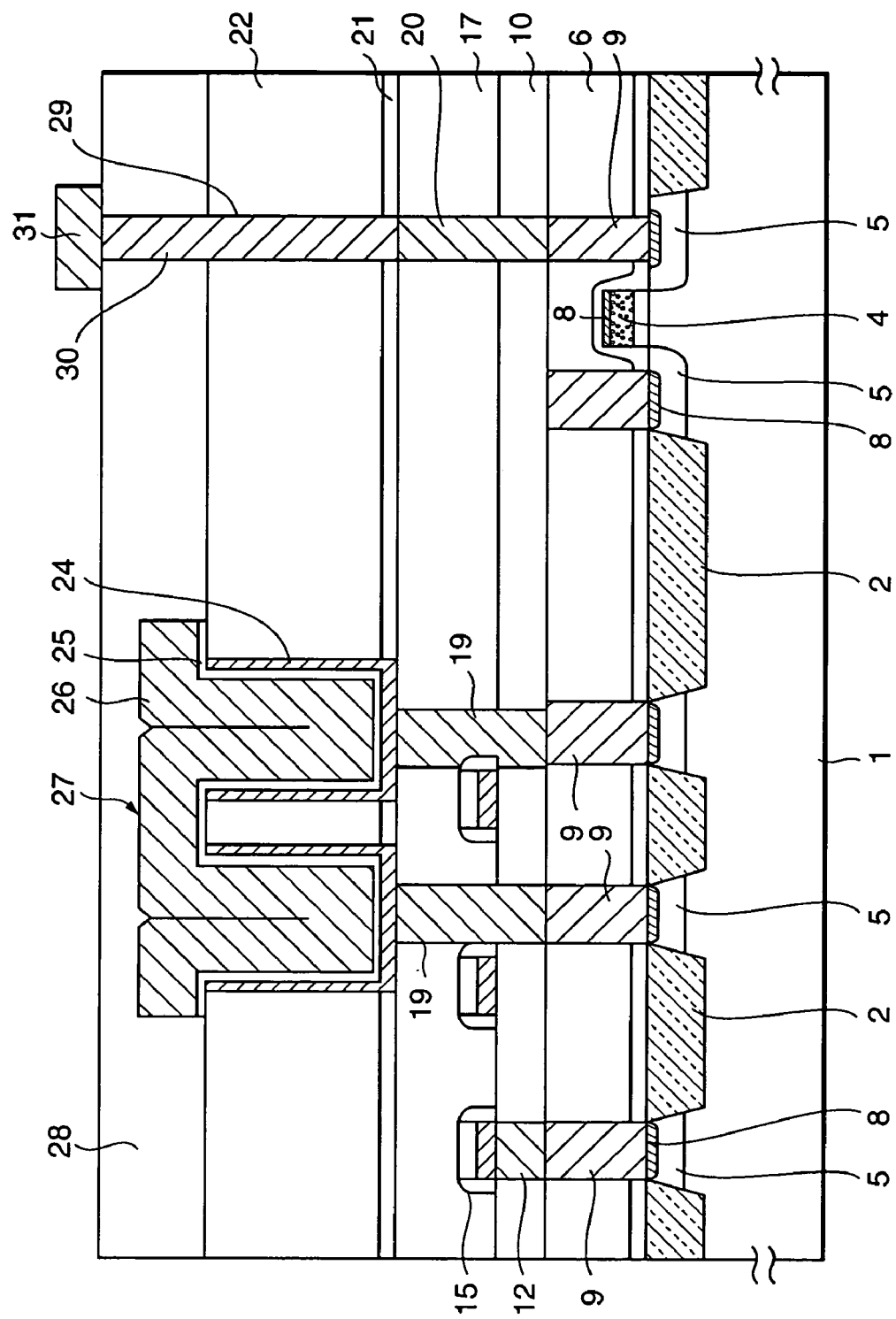
FIG. 1 is a cross sectional view of a semiconductor memory device as a first preferred embodiment of the present invention.
Figure 2:
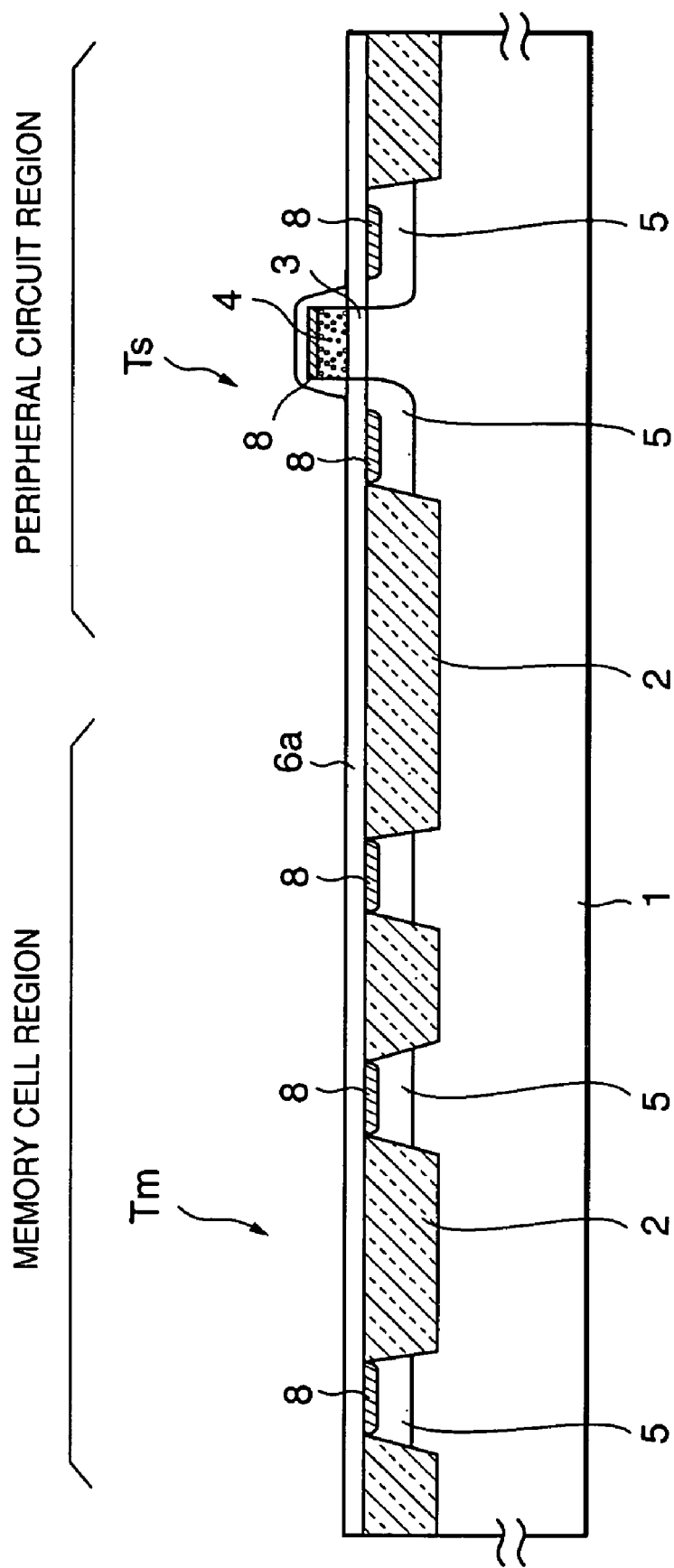
FIG. 2 is a cross sectional view for illustrating a first step of the process for manufacturing the semiconductor memory device of the first preferred embodiment.

Referring to FIGS. 1 and 2, the process for manufacturing a semiconductor memory device will be described. In these figures, FIG. 1 is a vertical cross sectional view of a semiconductor memory device as a first preferred embodiment of the present invention, where bit lines are formed at high densities to realize a highly integrated semiconductor device, while FIG. 2 illustrates one of the steps of the process for manufacturing such a semiconductor memory device.

At first, as shown in FIG. 2, a shallow groove is formed in a silicon substrate 1 just as in the case with a typical DRAM. Then, the groove is filled with an insulating material to form a device-separating insulation film (STI) 2 to compartmentalize a memory cell region and a peripheral circuit region in addition to compartmentalize individual cell regions in the memory cell region. Then, a gate insulation film 3 and a gate electrode 4, which are formed on the silicon substrate 1, which is only shown in a peripheral circuit region in the figure. Subsequently, the silicon substrate 1 is subjected to doping to form a source drain region 5 to provide a MOS transistor allowing the formation of a memory cell transistor Tm in a memory cell region and the formation of a peripheral circuit transistor Ts in a peripheral circuit region. Next, a diffusion layer of each transistor and the whole surface of a gate are subjected to the formation of silicide with cobalt (Co) to make a cobalt silicide layer 8. Subsequently, a silicon nitride film 6 that covers each of the transistors is formed on the surface of silicon substrate 1 including the surface of the STI2.

Figure 3:
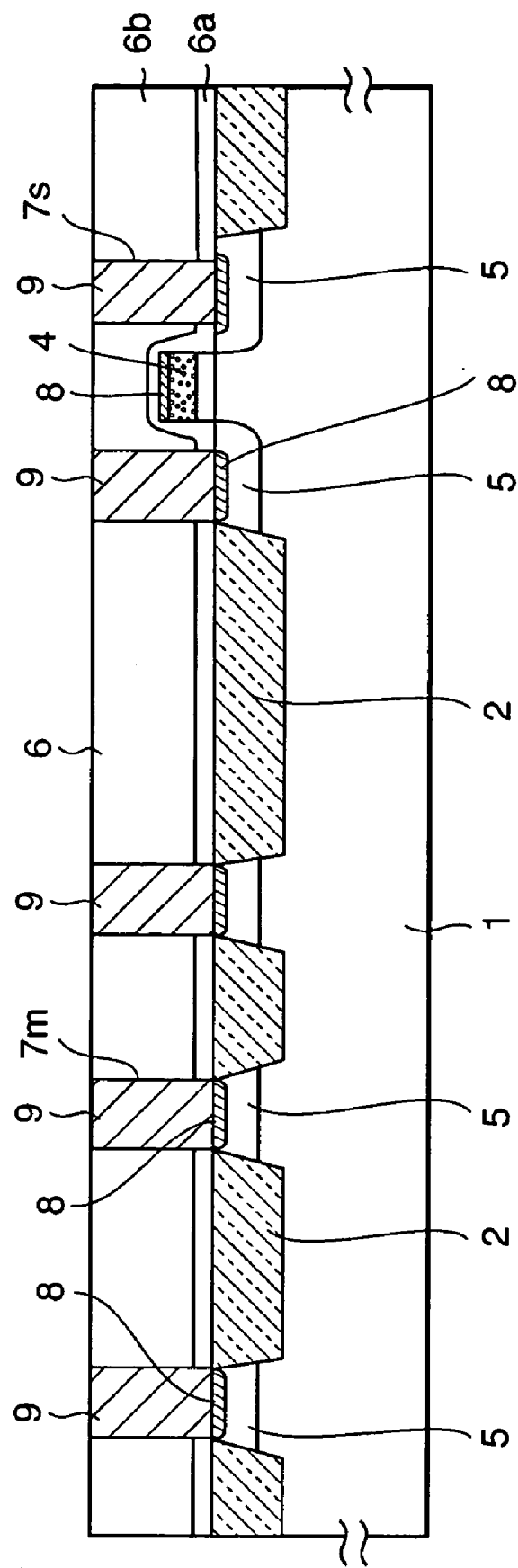
FIG. 3 is a cross sectional view for illustrating a second step of the process for manufacturing the semiconductor memory device of the first preferred embodiment.

Subsequently, as shown in FIG. 3, a silicon oxide film 6b is formed so as to cover the memory cell region and the peripheral circuit region of each transistor. A fist interlayer insulation film 6 is formed from a silicon oxide film 6a together with the silicon oxide film 6b. In the memory cell region, a contact hole 7m is formed for connecting the memory cell transistor Tm with a bit line and a capacitor. In the peripheral circuit region, on the other hand, a contact hole 7s is formed for connecting a metal wiring described later to a peripheral circuit transistor. These contact holes can be formed by selective etching, respectively. Subsequently, tungsten (W) is deposited by a CVD method such that it fills each of the contact holes 7m, 7s. Subsequently, the surface of the first interlayer insulation film 6 is flattened by a chemical mechanical polishing (CMP) such that each contact hole is remained as it is and the tungsten (W) is remained in each contact hole to provide a cell contact 9.

Figure 4:
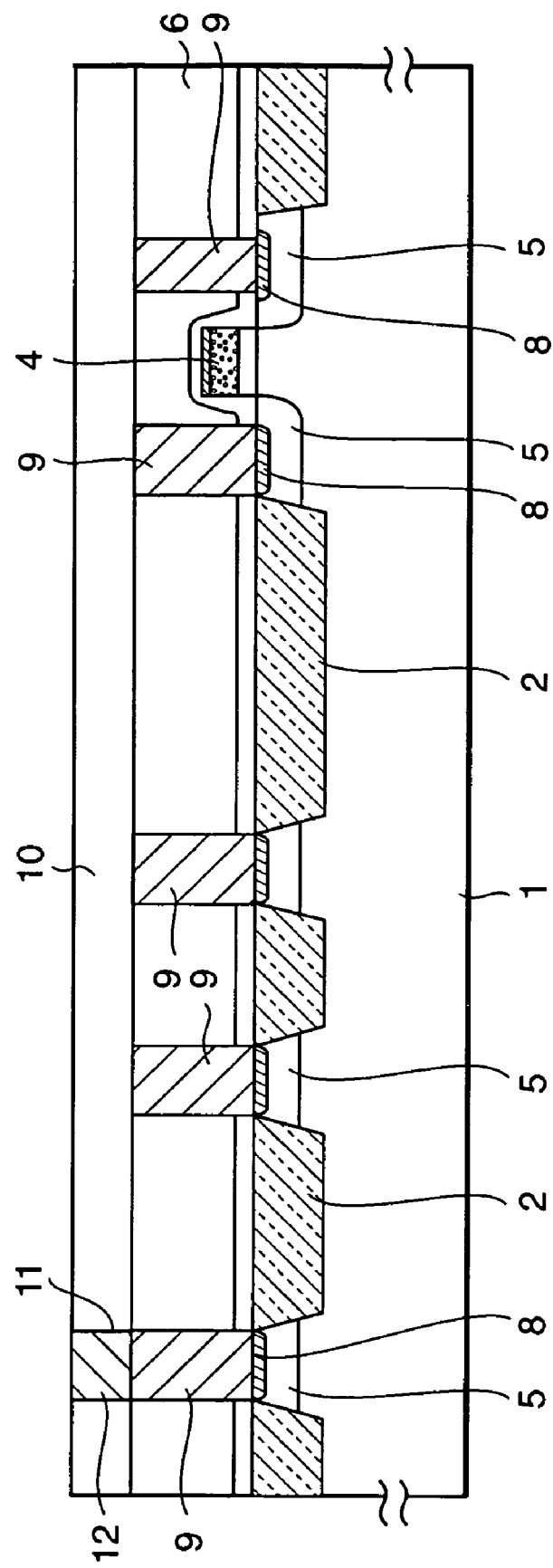
FIG. 4 is a cross sectional view for illustrating a third step of the process for manufacturing the semiconductor memory device of the first preferred embodiment.

Next, as shown in FIG. 4, a second interlayer insulation film 10 with a desired thickness is formed on the surface of the first interlayer insulation film at which the surface of the cell contact 9 is exposed, such that the surface of the cell contact 9 is covered with the second interlayer isolation film 10. In the second interlayer insulation film 10, a selective etching is performed on a position above the cell contact 9 to be electrically connected to the bit line to form a contact hole 11 to expose the upper surface of the cell contact 9. Subsequently, just as in the case with the cell contact, W is deposited using the CVD method such that the contact holes 11 is buried with W, followed by flattening the surface of the coat using the CMP method, while remaining W in the contact hole 11 to form a bit contact 12 for connecting to the bit lines.

Figure 5:
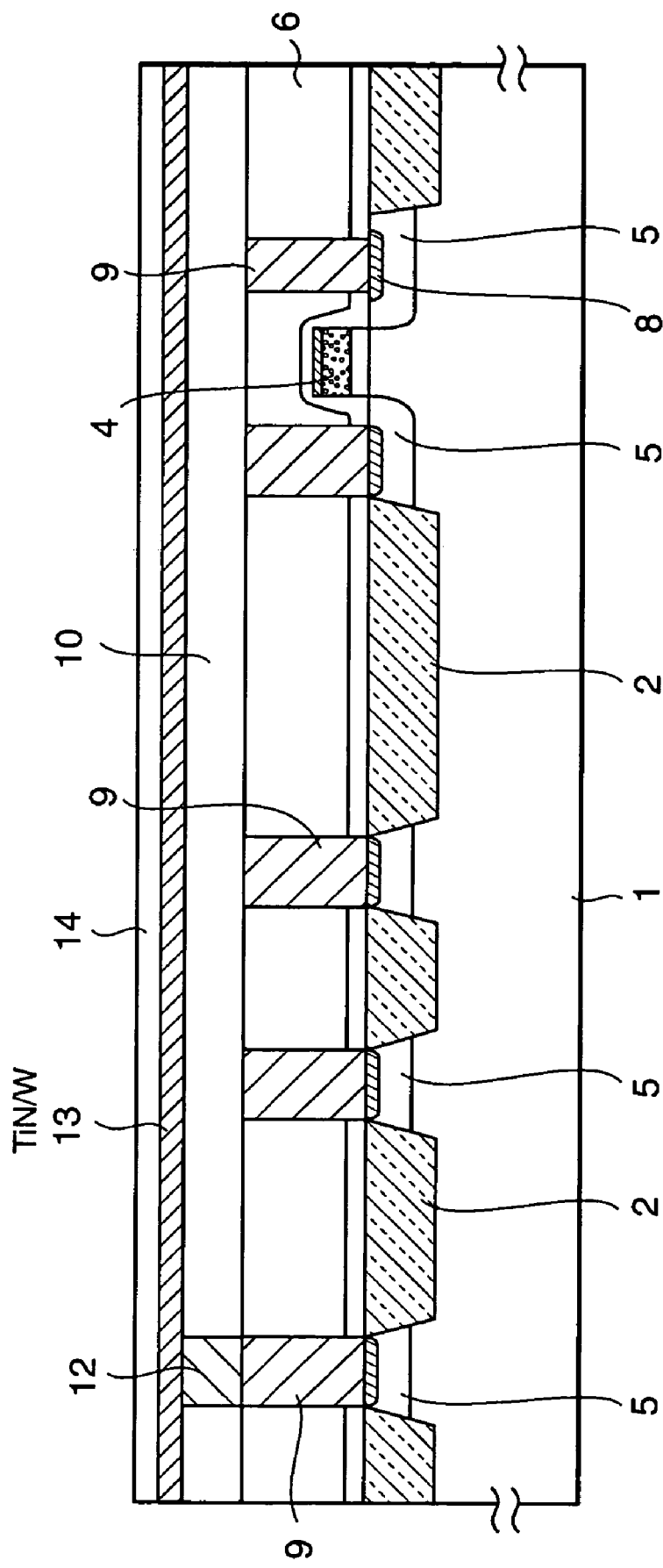
FIG. 5 is a cross sectional view for illustrating a fourth step of the process for manufacturing the semiconductor memory device of the first preferred embodiment.
Figure 6:
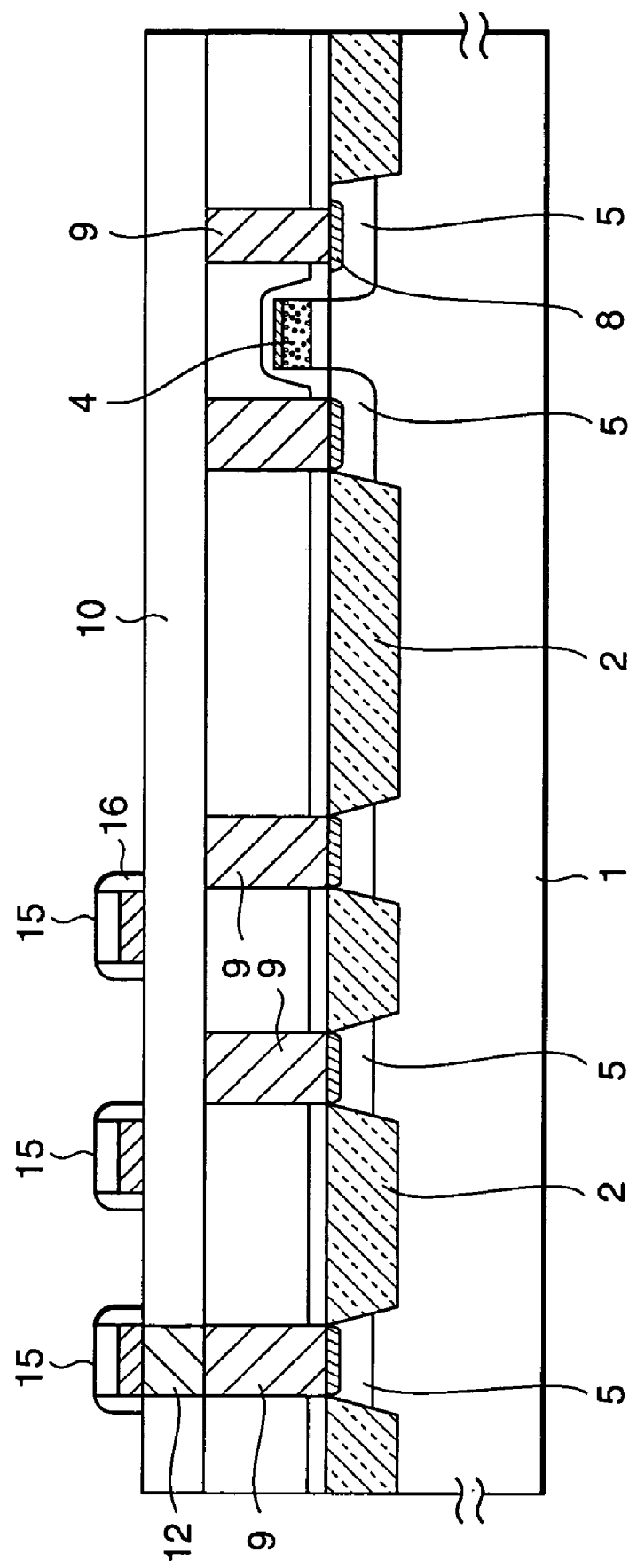
FIG. 6 is a cross sectional view for illustrating a fifth step of the process for manufacturing the semiconductor memory device of the first preferred embodiment.
Figure 7:
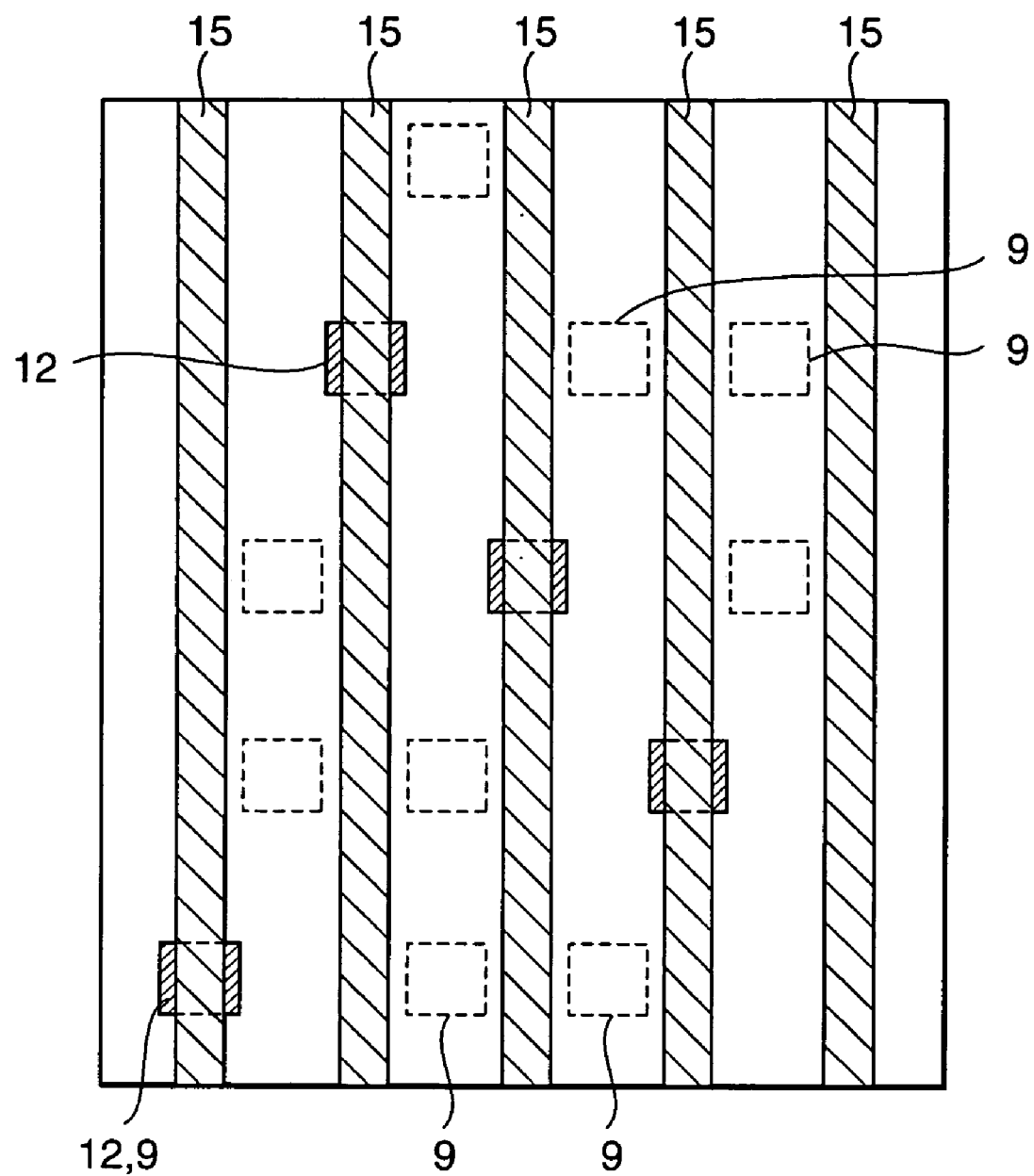
FIG. 7 is a cross sectional view for illustrating a sixth step of the process for manufacturing the semiconductor memory device of the first preferred embodiment.

Next, as shown in FIG. 5, TiN (titanium nitride) is provided as a bit line film 13 on the surface of a second interlayer insulation film. As a hard mask film 14, a laminated film made up of the silicon oxide film and the silicon nitride film. Then, as shown in FIG. 6, bit lines 15 are formed by patterning the hard mask film 14 and the bit line film 13 into the bit line shape using a photo resist mask (not shown). At this time, as shown in FIG. 7 that illustrates a planer layout of the semiconductor memory device, each of the bit lines 15 extends over the bit contact 12. The bit line 15 electrically connects to such a bit contact 12 and also electrically connects to the memory cell transistor Tm through the cell contact 9. On the other hand, the cell contact 9 without connecting to the bit line 15 is covered with the second interlayer insulation film 10, so that the bit line 15 and the cell contact 9 can be never short-circuited even if the bit line 15 is displaced from a predetermined position. Subsequently, a silicon nitride film having a desired thickness is grown entirely on the surface of the bit line 15 as predetermined thickness, and then entirely subjecting the surface of the bit line 15 to etch buck to remain the side surface of the bit line 15, resulting in a side wall 16. As the configuration of the semiconductor memory device shown in FIG. 7 is an exemplified cross sectional diagram, it does not correspond to each of the above cross sectional views.

Figure 8:
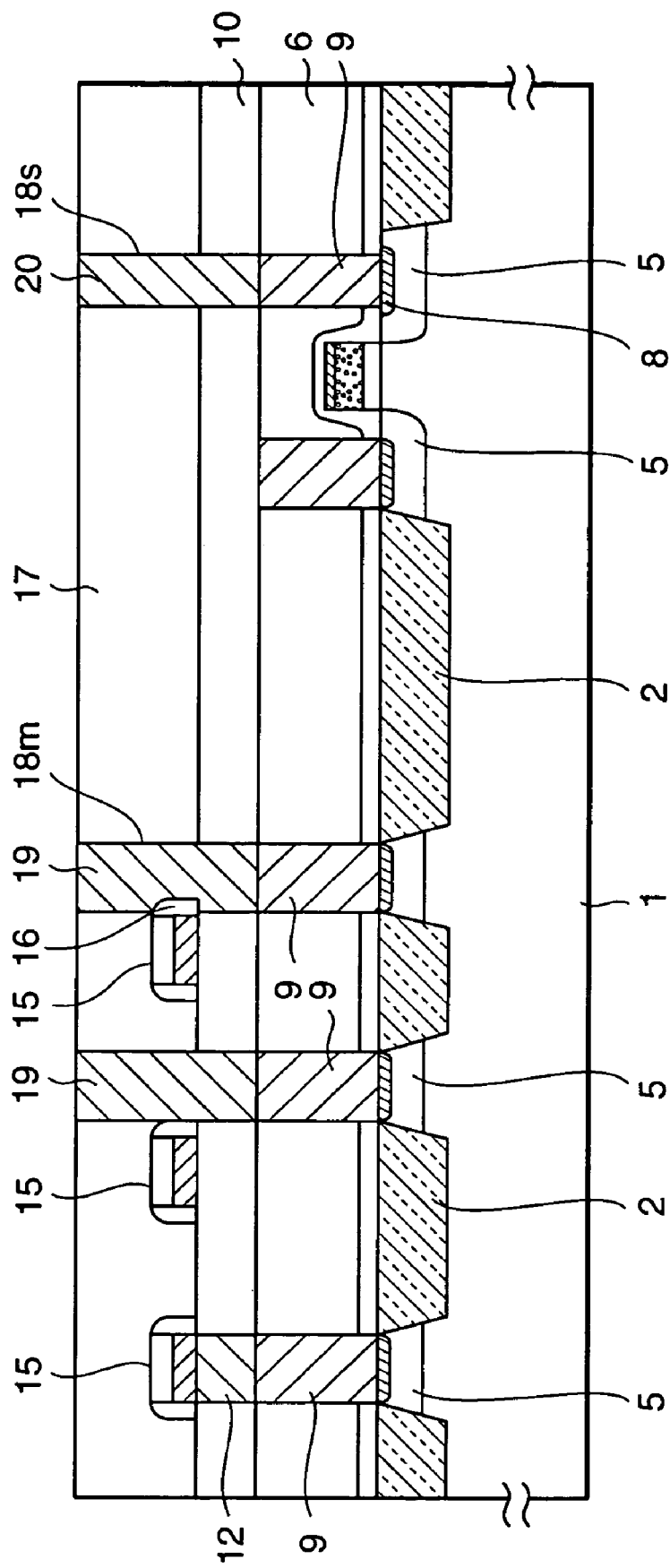
FIG. 8 is a cross sectional view for illustrating a seventh step of the process for manufacturing the semiconductor memory device of the first preferred embodiment.

Next, as shown in FIG. 8, a third interlayer insulation film 17 is formed using a silicon oxide film so as to cover the bit line 15. Among the cell contacts 9, a position directly above the cell contact electrically connected to the capacitor described below and a position directly above the cell contact electrically connected to the metal wiring of the peripheral circuit region described below are selectively etched to form contact holes 18m, 18s. At this time, especially the contact hole 18m of the memory cell region may be displaced from a predetermined position. Even though a contact hole 18m is formed at a position on which a part of the contact hole 18m and the bit line 15 are overlapped, the side wall 16 of the side surface of the bit line 15 is a silicon nitride film and is not subjected to etching at an etching selective ratio with a silicon oxide film of the third interlayer insulating film 17, while forming a contact hole 18m with a self alignment. Therefore, there is no possibility that the bit line film 13 of the bit line 15 is exposed in the contact hole 18m. Just as in the case with the cell contact or bit contact, tungsten (W) is deposited using the CVD method until the contact holes 18m, 18s are buried with tungsten (W), followed by flattening the surface thereof using the CMP method to only remain the tungsten (W) in the contact hole. In the memory cell region, furthermore, a capacitor contact hole 19 for connecting to the capacitor is formed. In the peripheral circuit region, a lower metal contact 20 for connecting to a metal wiring described below is formed.

Figure 9:
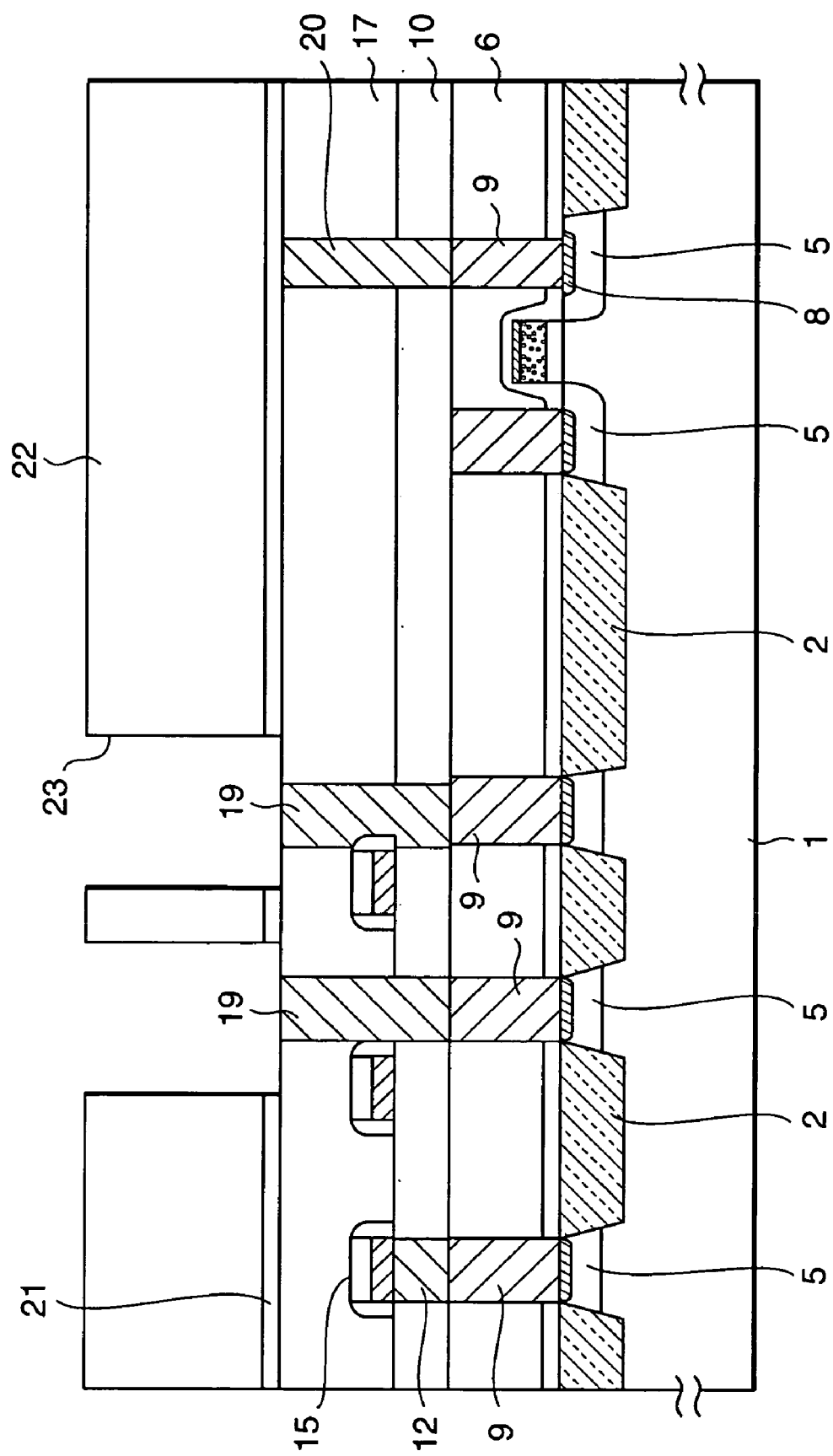
FIG. 9 is a cross sectional view for illustrating an eighth step of the process for manufacturing the semiconductor memory device of the first preferred embodiment.
Figure 10:
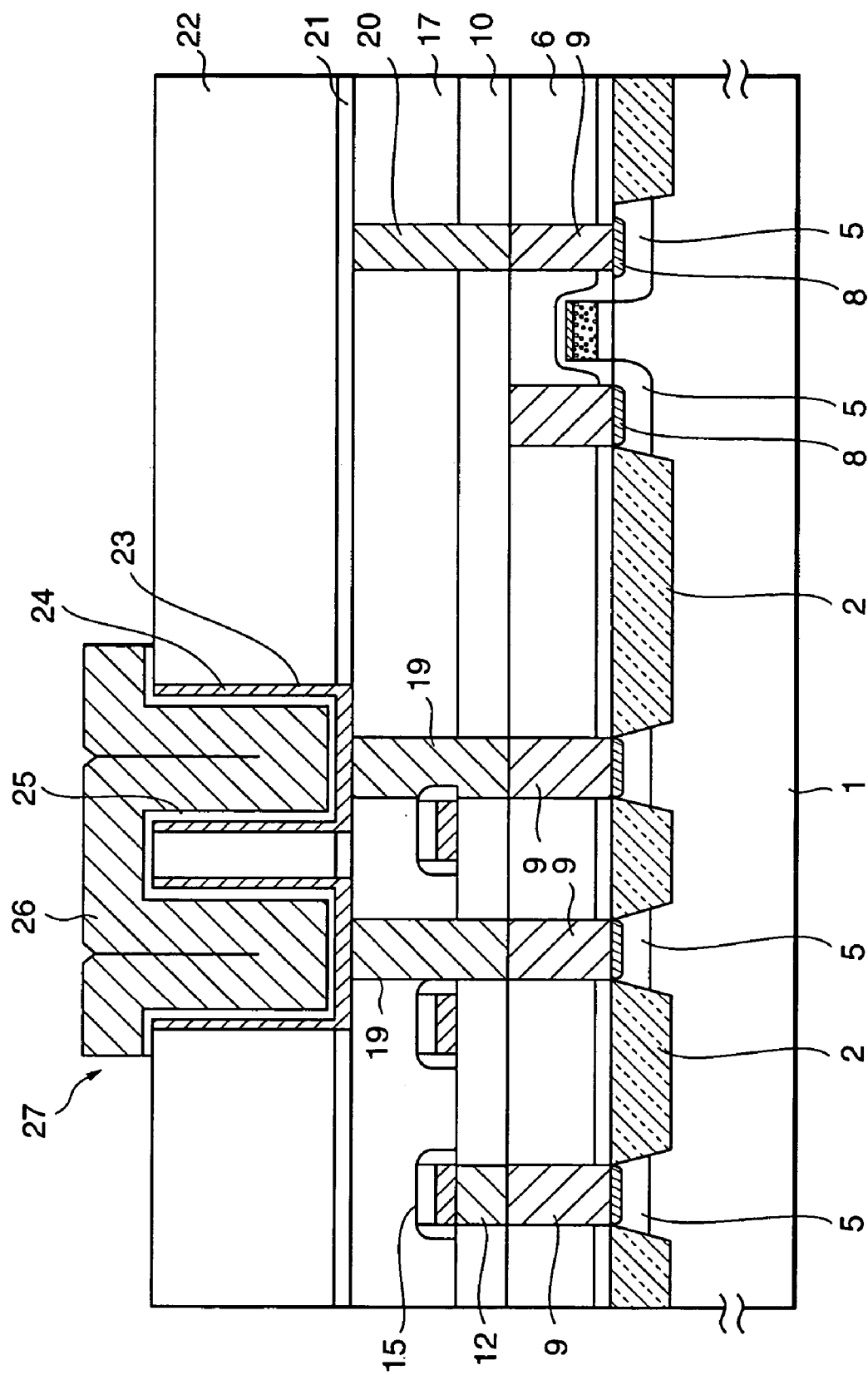
FIG. 10 is a cross sectional view for illustrating a ninth step of the process for manufacturing the semiconductor memory device of the first preferred embodiment.

Next, as shown in FIG. 9, an etching stopper film 21 made of a silicon nitride film is formed on the entire surface, followed by forming a fourth layered insulating film 22 made of a silicon oxide film for covering the capacitor contact 19 and the lower metal contact 20. Furthermore, a cylindrically recessed portion 23 having a large diameter is formed by etching the etching stopper film 21 and a fourth interlayer insulating film 22 of the region directly above the capacitor contact 19 using a photo resist mask (not shown) into a circular shape. Concurrently, the bottom surface of the region of the cylindrical recessed portion 23 exposed at the upper end of the capacitor contact 19. As shown in FIG. 10, a TiN film is entirely formed in the inner surface of the cylindrical groove 23. Only an area of the cylindrical recessed portion 23 is covered with a photo resist mask (not shown), followed by performing an etch back on the TiN film to form a lower electrode 24 while remaining the TiN film in the cylindrical recessed portion 23. Furthermore, an insulation film such as a Ta oxide film is formed on the surface of a lower electrode 24, followed by forming a laminate film of W and TiN. Then, the laminate film and the insulation film are formed into a desired pattern to obtain an upper electrode 26 and a capacitor insulation film 25. Therefore, a cylindrical capacitor 27 is formed.

Furthermore, as shown in FIG. 1, a fifth interlayer insulation film 28 is formed so as to cover the capacitor 27. Then, the fifth interlayer insulation film 28 and the fourth interlayer insulation film 22 are selectively etched in sequence directly above the lower metal contact 20 in the periphery circuit region. Furthermore, a contact hole 29 is formed by etching a lower etching stopper film 21 to expose the upper end surface of the lower metal contact. Subsequently, tungsten (W) is deposited by the CVD method until the contact hole 29 is buried. Then, the surface is flattened by the CMP method to only remain the tungsten W in the contact hole 29 to form an upper metal contact 30. Furthermore, an aluminum (Al) film is formed on the fifth interlayer insulation film 28 to form a metal wiring 31 with a desired pattern. The metal wiring 31 is electrically connected to the peripheral circuit transistor Ts through the upper metal contact 30, the lower metal contact 20, and the cell contact 9.

Consequently, the semiconductor memory device shown in FIG. 1 can be manufactured by the process including the above steps. In the configuration of the semiconductor memory device of the first preferred embodiment, the second interlayer insulation film 10 covers the upper end surface of the cell contact 9, so that an undesired short circuit to be caused with the cell contact 9 can be prevented even though the bit line 15 formed on the second interlayer insulation film 10 in the memory cell region is displaced from a predetermined position. In addition, a side wall 16 is formed on the bit line 15. Then, the contact hole for the capacitor contact 19 is formed using an etching selectivity of the side wall 16 and the second and third interlayer insulation films 10, 17, so that an undesired short circuit to be caused between the bit line 15 and the capacitor contact 19 can be prevented even though the capacitor contact 19 is displaced from a predetermined position. Consequently, it becomes possible to decrease the designed configuration margin of the bit line 15 and the capacitor contact 19 and to increase the configuration densities of the bit line 15 and the capacitor contact 19, i.e., the configuration densities of the capacitor 27, realizing the production of a highly-integrated DRAM. In the semiconductor device having DRAM (memory cell) and the peripheral circuit in combination, as a contact structure electrically connecting the transistor with the metal wiring, the cell contact 9, the lower metal contact 20, and the upper metal contact 30 are stacked, the depth of each contact can be decreased and a minute contact can be easily manufactured, which can be effective to make a high density semiconductor memory device.

Figure 11:
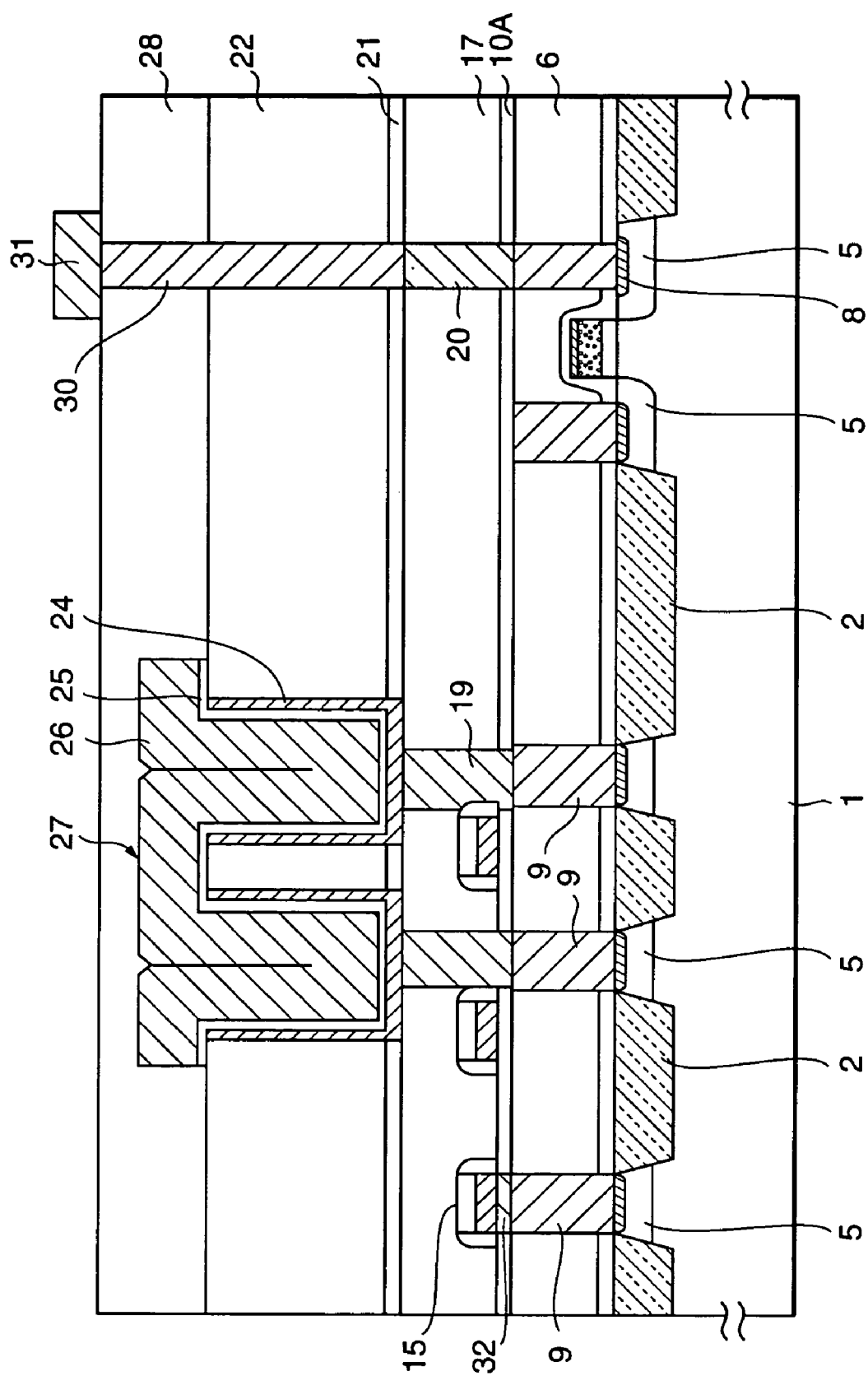
FIG. 11 is a cross sectional view of a semiconductor memory device of a modified example of the first preferred embodiment.

Here, as a modified example of the first semiconductor, as shown in FIG. 11, the second internal interlayer insulation film 10A that covers the upper end surface may be prepared from a thin silicon oxide. In this case, a window 32 at which the upper end surface of the cell contact 9 may be formed in the second interlayer insulation film 10A, followed by forming the bit line 15 thereon to allow an electrical connection between the bit line 15 and the cell contact 9. In this case, therefore, there is no need to perform the CMP step or the like for forming a bit contact 12, allowing a simplification of the manufacturing process. In addition, the thickness of the whole interlayer insulation film of the semiconductor memory device can be reduced. Furthermore, the process for manufacturing the lower mental contact 20 in the peripheral circuit region can be easily attained.

Figure 12:
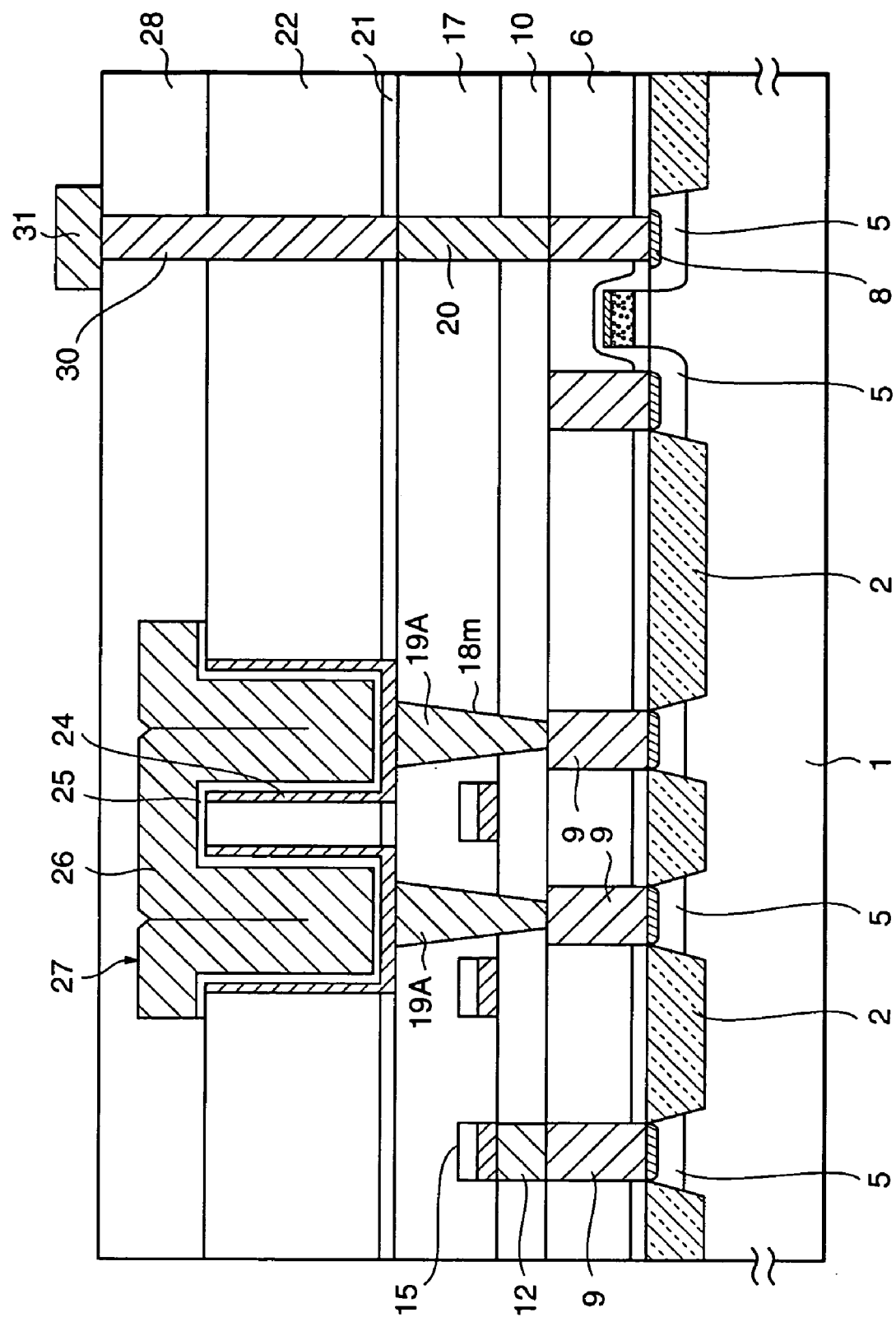
FIG. 12 is a cross sectional view of a semiconductor memory device of another modified example of the first preferred embodiment.

In the above embodiment, at the time of forming the capacitor contact 19, the side wall 16 is formed on the side of the bit line 15, followed by forming a contact hole 18m using a self-alignment method that utilizes an etching selection ratio between the side wall 16 and the third interlayer insulating film 17. Alternatively, such a contact hole 18m may be formed using an etching method using a photo resist mask or another etching method with a smaller anisotropic property in stead of the self alignment method. The second semiconductor memory device of the present invention is prepared sing such a method. In addition, as shown in FIG. 12, a capacitor contact 19A is formed on the basis of the contact hole 18m formed by downwardly etching from the surface side of the third interlayer insulation film 17. Thus, the capacitor contact 19A is shaped like a reversed taper where the diameter of the lower part adjacent to the bit line 15 is smaller than the diameter of the upper part, so that a short circuit between the capacitor contact 19A and the bit line 15 can be prevented because of their interaction even though the capacitor contact 19A is displaced from a predetermined position.

Figure 13:
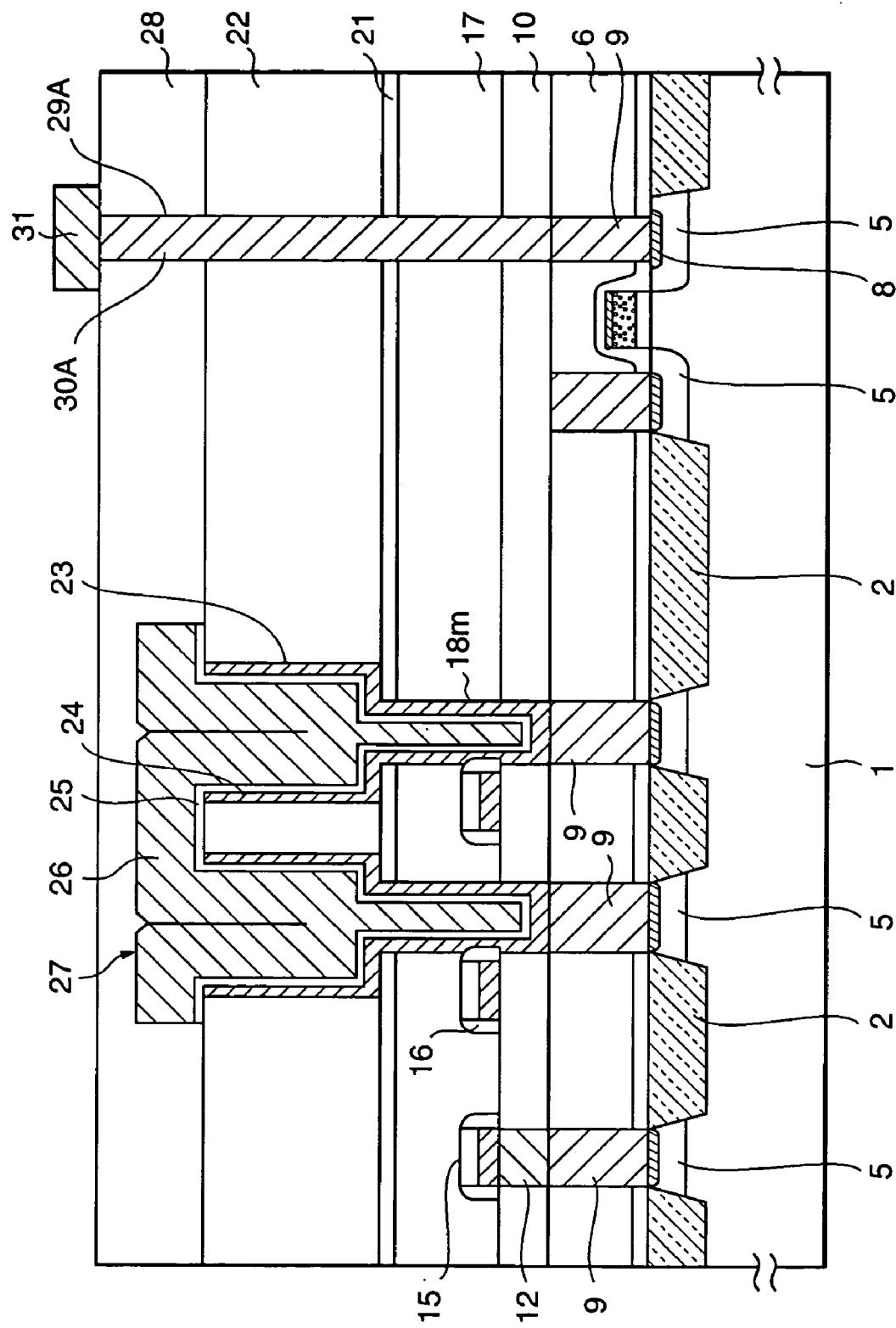
FIG. 13 is a cross sectional view of a semiconductor memory device as a second preferred embodiment of the present invention.
Figure 14:
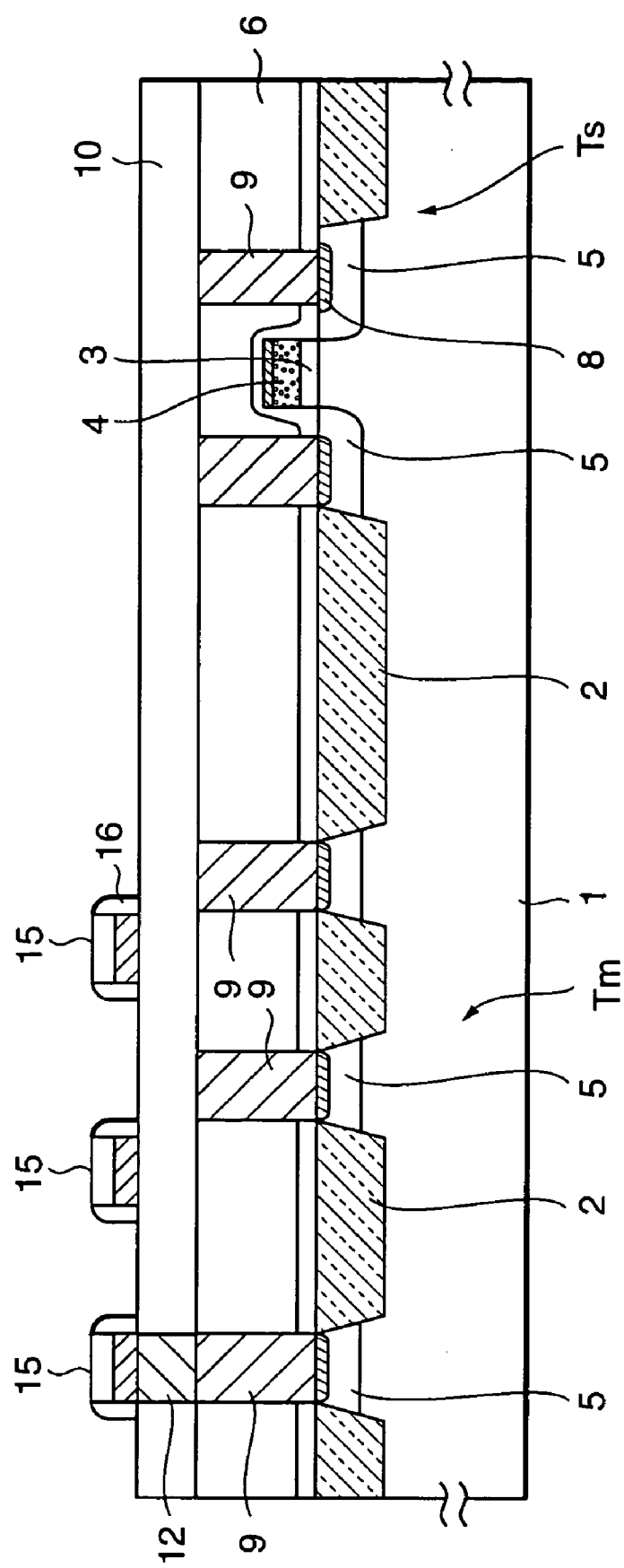
FIG. 14 is a cross sectional view for illustrating a first step of the process for manufacturing the semiconductor memory device of the second preferred embodiment.

Referring now to FIG. 13, there is shown a semiconductor memory device as a second preferred embodiment of the present invention. In each of FIGS. 14 to 17, there is shown one of the steps in the process for manufacturing a semiconductor memory device of the second preferred embodiment. At first, as shown in FIG. 14, just as in the case with the first embodiment, a memory cell transistor Tm is formed on a memory cell region of a silicon substrate 1, while a peripheral circuit transistor Ts is formed on a peripheral circuit region. Then, a first interlayer insulation film 6 made of a silicon nitride film and a silicon oxide film are formed such that it covers each of transistors Tm, Ts on the memory cell region and the peripheral circuit region, respectively. Cell contacts 9 are formed on the memory cell region and the peripheral circuit region for making connections with the transistors Tm, Ts, respectively. Furthermore, on the surface of the first interlayer insulation film 6, a second interlayer insulation film 10 made of a silicon oxide film having a predetermined thickness is formed. Then, each of bit contacts 12 to be connected to a part of the cell contact 10 is formed, followed by forming bit lines 15 to be connected to the respective bit contacts 12. In this embodiment, just as in the case with the first embodiment, a side wall 16 is formed on the side surface of the bit line 15. Alternatively, the side wall 16 may be omitted when the capacitor contact described below may be hardly short-circuited depending on the densities of the bit lines 15 being arranged.

Figure 15:
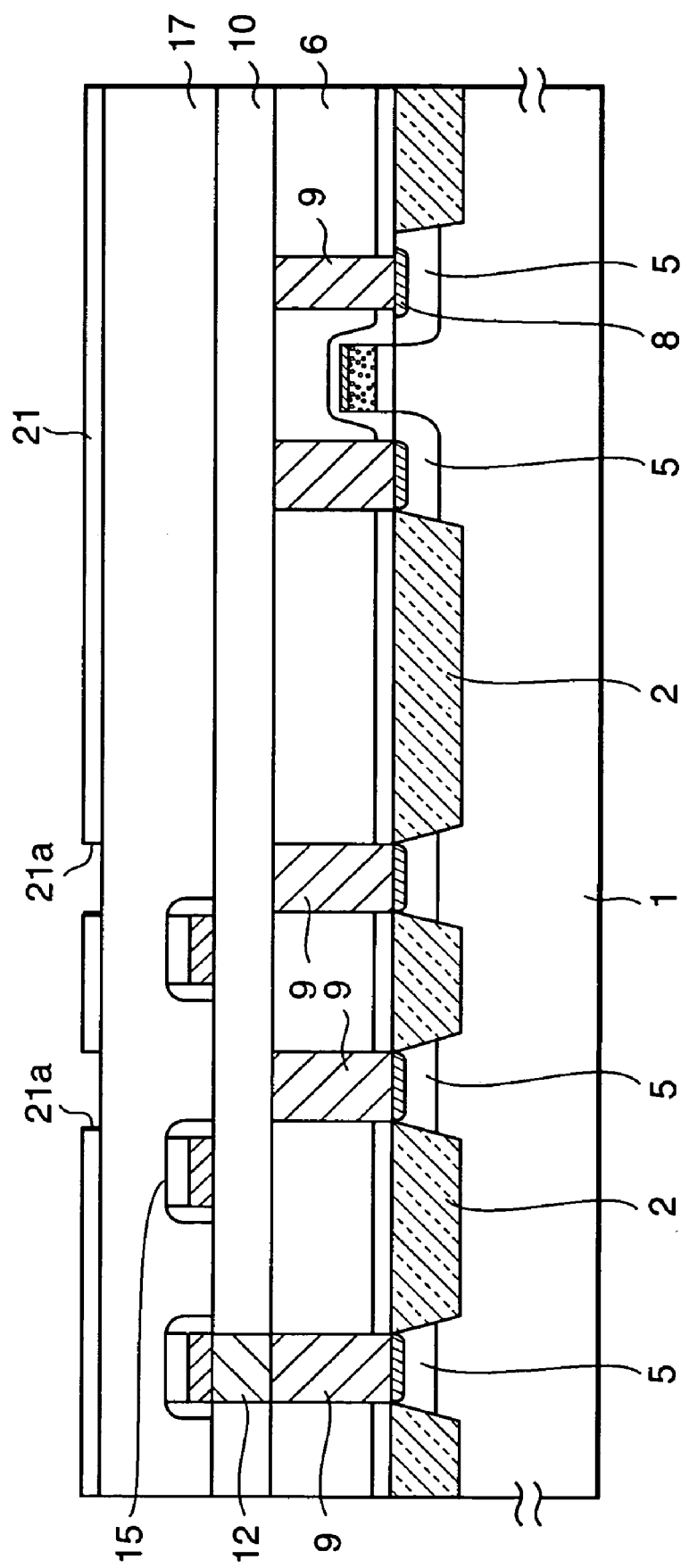
FIG. 15 is a cross sectional view for illustrating a second step of the process for manufacturing the semiconductor memory device of the second preferred embodiment.
Figure 16:
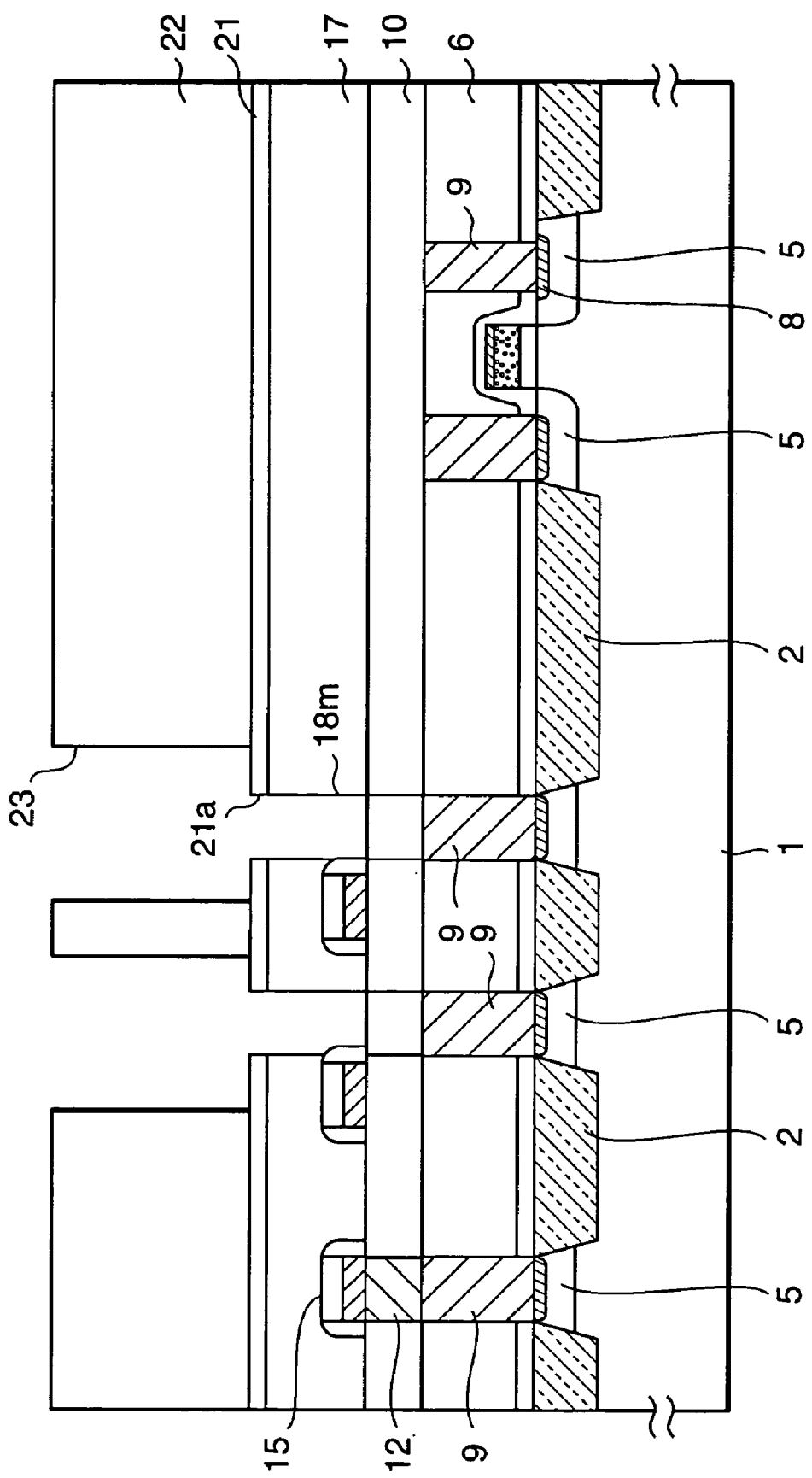
FIG. 16 is a cross sectional view for illustrating a third step of the process for manufacturing the semiconductor memory device of the second preferred embodiment.

Subsequently, as shown in FIG. 15, after the formation of a third interlayer insulation film that covers the bit line, an etching stopper film 21 made of a silicon nitride film is formed on the surface of a third interlayer insulation film 17 without forming a capacitor contact, in this second embodiment. Then, a selective etching is performed to form an opening window 21a in an area above the cell contact 9 of the region where the capacitor is formed using a photo resist mask (not shown). Then, as shown in FIG. 16, after removing the photo resist mask, a fourth interlayer insulation film 22 is formed on the etching stopper film 21. A selective etching is then performed on a circular area including the opening window 21a in the fourth interlayer insulation film 22 using a photo resist mask (not shown) to form a large-diameter cylindrical recessed portion 23 extending to the etching stopper film 21. At this time, in the bottom surface of the cylindrical recessed portion 23, the etching proceeds to the third interlayer insulation film 17 and the second insulation film 10 under the opening window 21a in the etching stopper film 21 through such a window 21a. As a result, a contact hole 18m by which the upper end surface of the cell contact 9 is exposed on the bottom surface of the cylindrical recessed portion 23. In general, the diameter of the cylindrical recessed portion 23 is in the range of 400 to 500 nm, while the diameter of the contact hole 18m is approximately 180 nm.

Figure 17:
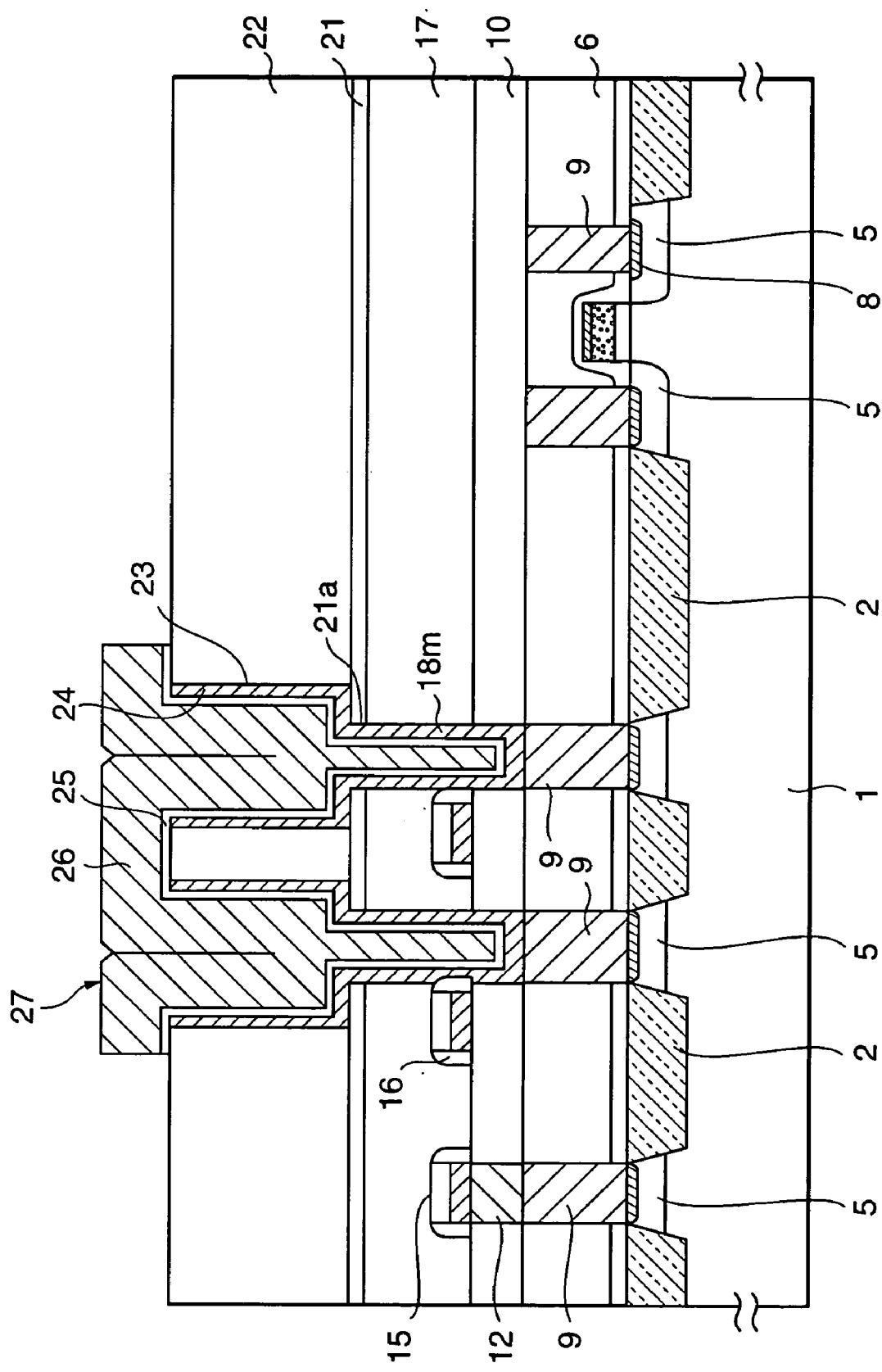
FIG. 17 is a cross sectional view for illustrating a fourth step of the process for manufacturing the semiconductor memory device of the second preferred embodiment.
Figure 18:
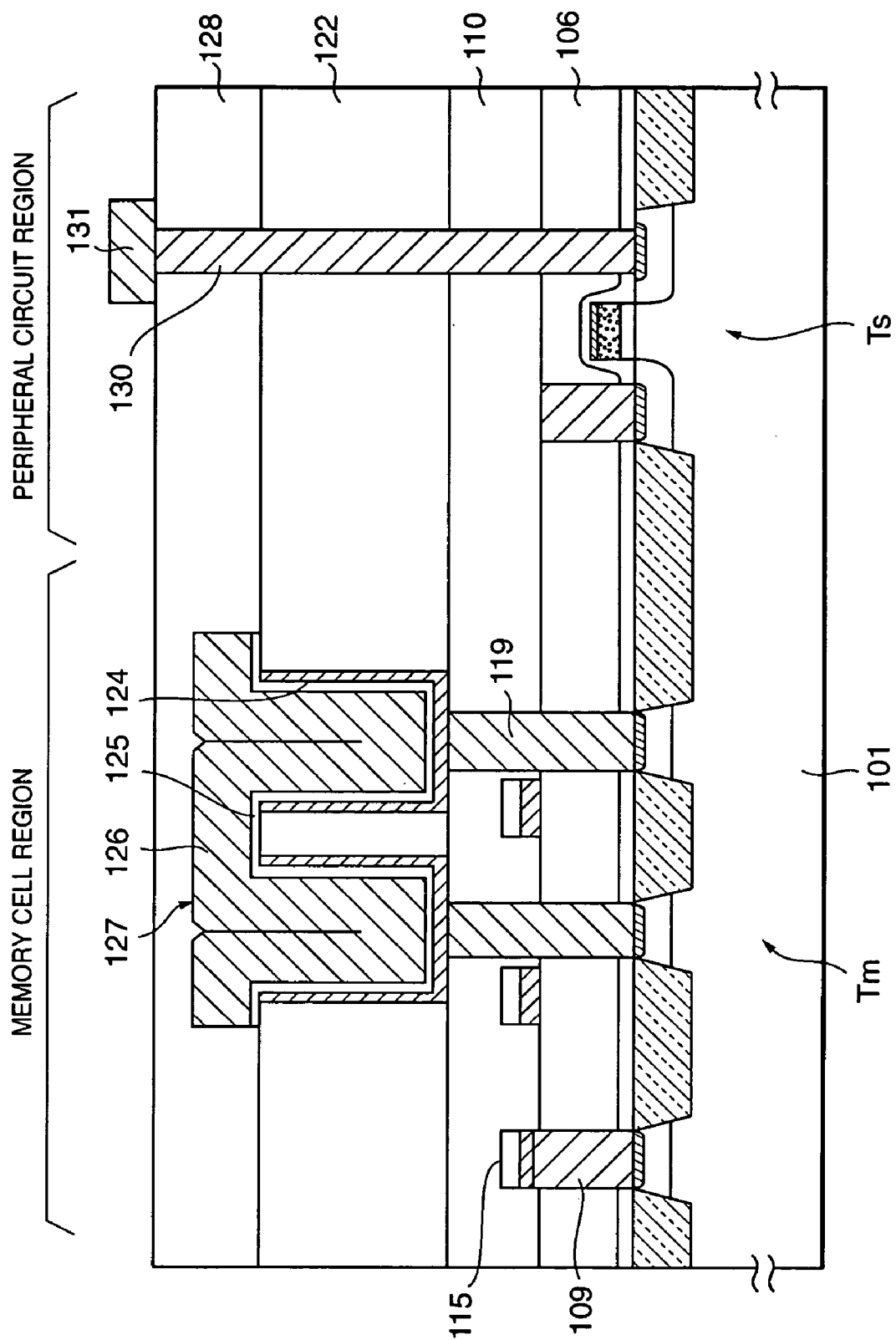
FIG. 18 is a cross sectional view of one of the conventional semiconductor memory devices.
Figure 19:
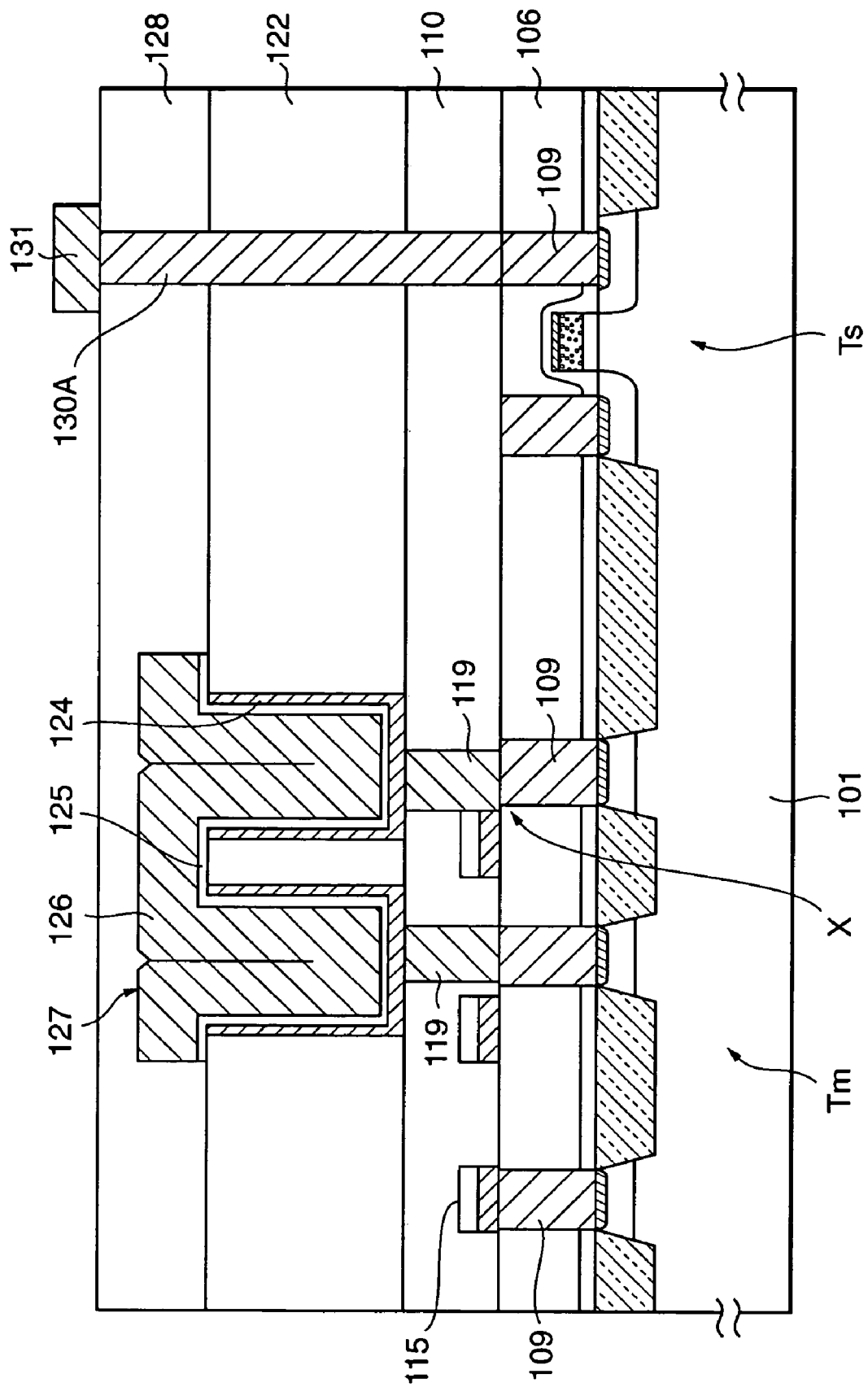
FIG. 19 is a cross sectional view of another conventional memory device.

Subsequently, as shown in FIG. 17, a TiN film is formed on the whole surface including the cylindrical recessed portion 23 of the fourth interlayer insulation film 22 and the contact holes of the second and third interlayer insulation films 10, 17. Then, a photo resist mask (not shown) is applied only on the outer region of the cylindrical recessed portion 23, followed by performing etch back to the TiN film to form a lower electrode 24 while the cylindrical recessed portion 23 and the contact hole 18m are remained as they are. By the way, this lower electrode 24 is electrically connected to the cell contact 9 at the bottom surface of the contact hole 18m. Furthermore, after forming an insulation film such as a Ta oxidation film on the surface of the lower electrode 24, a laminated film of tungsten (W) and TiN is formed so as to bury cylindrical recessed portion and the contact holes. Then, the laminated film and the insulation film are shaped into a predetermined pattern to form an upper electrode 26 and a capacitor insulation film 25. Consequently, a cylindrically-shaped capacitor 27 is formed along the inner surfaces of the cylindrical recessed portion 23 and the contact hole 18m, respectively. The lower electrode 24 is electrically connected to the memory cell transistor Tm through the cell contact 9. In this embodiment, for example, a film thickness of the lower electrode 24 may be 10 nm, while a film thickness of the capacitor insulation film 25 may be in the range of 6 to 8 nm.

Furthermore, as shown in FIG. 13, a fifth interlayer insulation film 28 is formed so as to cover the capacitor 27. The fourth and fifth interlayer insulation films 22, 28 can be selectively etched, directly above the contacts 9 of the peripheral circuit region. Furthermore, the etching stopper film 21 is also etched, followed by selectively etching the second and third interlayer insulation films 10, 17 to form a contact hole 29A such that the upper end surface of the contact 9 is exposed at the bottom surface of the contact hole 29A. Subsequently, tungsten (W) is deposited by the CVD method for burying the contact hole 29A, followed by flattening the surface by the CMP method to form a metal contact 30A while remaining tungsten in the contact hole 29A. Furthermore, aluminum (Al) film is formed on the fifth interlayer insulation film 28 and is then shaped into a predetermined pattern to form a metal wiring 31. This metal wiring 31 can be electrically connected to the peripheral circuit transistor Ts through the metal contact 30A and the cell contact 9.

Consequently, the third semiconductor memory device of the present invention as shown in FIG. 13 can be manufactured by the process including the steps described above.

In the second embodiment, as described above, the capacitor 27 is constructed not only of the inside of the cylindrical recessed portion 23 in the fourth interlayer insulation film 22 but also of the laminated structure made up of the lower electrode 24, the capacitor insulation film 25, and the upper electrode 26 in the inner surface of the contact hole 18m formed through the second and third interlayer insulation film 10, 17.

Comparing with the conventional semiconductor memory device, therefore, the surface area of the capacitor increases as much as the area of the inner surface of the contact hole 18m. For obtaining the same capacitance value, it is possible to reduce a film thickness of the fourth interlayer insulation film 22 and the diameter of the cylindrical recessed portion 23. Therefore, by reducing a film thickness of the fourth interlayer insulation film 22, the diameter of the cylindrical recessed portion 23 can be reduced. Accordingly, the reduction in a film thickness of the four interlayer insulation film 22, it becomes possible to reduce the diameter of the cylindrical recessed portion 23. As a result, a film thickness of the entire semiconductor memory device can be reduced as a film thickness of the fourth interlayer insulation film 22 decreases. In this case, more specifically, the depth of the contact hole 29A for the formation of the metal contact 30A in the peripheral circuit region can be decreased, so that the production of the semiconductor memory device can be simplified.

Furthermore, it also becomes possible to attain a high degree of integration by reducing the diameter of the capacitor 27. The lower electrode 24 embodied in the contact hole 18m extending over the second and third interlayer insulation film 10, 17 is directly connected to the cell contact 9 and is functioned as a capacitor contact, so that there is no need to include the CVD and CMP steps of tungsten (W) for making the capacitor contact, allowing the reduction in the number of the steps.

In each embodiment described above, DRAM in which the memory cell and the peripheral circuit such as the logic circuit are integrally formed on the semiconductor substrate has been explained. According to the present invention, however, it is not limited to such a configuration. As will be appreciated by a person skilled in the art, the present invention can be also applied on generalized DRAM in which only memory cell is formed on the semiconductor device without departing from the spirit and the scope of the invention. As will be also appreciated by a person skilled in the art, the interlayer insulation films and the conductive materials in each of the above embodiments can be appropriately changed to other materials if required without departing from the spirit and the scope of the present invention.

As described above, the first and second semiconductor memory devices of the present invention prevents a short circuit with the cell contact even though the bit line is displaced from the predetermined position since the cell contact is covered with the second interlayer insulation film and the bit contact is formed only at a position to be connected to the cell content. In addition, even though the capacitor contact is displaced from a predetermined position, it is possible to prevent a short circuit with the bit line. Therefore, the margin of the bit line and the capacitor contact can be reduced. In other words, the configuration densities of the capacitor can be improved and the production of highly integrated DRAM can be realized.

In the third semiconductor memory device of the present invention, the capacitor is constructed of the laminated structure made up of the lower electrode, the capacitor insulation film, and the upper electrode in the inner surface of the contact hole formed in the lower interlayer insulation film in addition to the inside of the cylindrical recessed portion formed on the interlayer insulation film. Therefore, the capacitor area can be increased as much as an inner surface area of the contact hole. Thus, a film thickness of the interlayer insulation film, on which the recessed portion for the formation of the capacitor is formed, can be reduced while obtaining the desired film thickness. In addition, it becomes possible to attain the desired capacitance even though the reduction in the diameter of the recessed portion. Consequently, the total film thickness of the interlayer insulation film can be decreased and the depth of the metal contact is then decreased, allowing a high integration.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device comprising:
   a semiconductor substrate;
   a memory cell transistor having first and second regions selectively formed in said semiconductor substrate;
   a peripheral transistor having a third region selectively formed in said semiconductor substrate;
   first, second and third silicide layers formed in direct contact with said first, second and third regions, respectively;
   a first insulating layer covering said semiconductor substrate and said first, second and third suicide layers;
   a bit line formed on said first insulating layer;
   a first conductive layer made of a metal and embedded into said first insulating layer to form an electrical path between said bit line and said first silicide layer;
   a second insulating layer covering said bit line and said first insulating layer;
   a capacitor formed on said second insulating layer; said capacitor having a lower electrode made of a metal, an upper electrode made of a metal and a dielectric layer sandwiched between said lower and upper electrodes;
   a second conductive layer made of a metal and embedded into said first and second insulating layers to form an electrical path between said lower electrode of said capacitor and said second silicide layer;
   a third insulating layer covering said capacitor and said second insulating layer;
   a third conductive layer made of a metal and formed in said first, second and third insulating layers in contact with said third suicide layer; and
   a wiring layer formed on said third insulating layer in contact with said third conductive layer,
   wherein said third conductive layer is elongated straightly without a bend between said third suicide layer and said wiring layer,
   wherein said first insulating layer comprises first and second insulating films, said first conductive layer being embedded into said first insulating film in contact with said first suicide layer, said bit line being in electrical contact with said first conductive layer through a hole formed in said second insulating film, said second conductive layer including first and second conductive plugs said first conductive plug being embedded into said first insulating film, said second conductive plug being embedded into said second insulating film and said second insulating layer, and wherein said third conductive layer comprises third, fourth and fifth conductive plugs, said third conductive plug being embedded into said first insulating film, said fourth conductive plug being embedded into said second insulating film and said second insulating layer, and said fifth conductive plug embedded into said third insulating layer.

2. The device as claimed in claim 1, wherein said fourth conductive plug is substantially the same in height as said second conductive plug, and wherein lower ends of said second conductive plug and said fourth conductive plug substantially coincide with a lower surface of said second insulating film, and upper ends of said second conductive plug and said fourth conductive plug substantially coincide with an upper surface of said second insulating layer.

3. The device as claimed in claim 1, wherein said first conductive plug is substantially the same in height as said third conductive plug, and wherein upper ends of said first conductive plug and said third conductive plug substantially coincide with an upper surface of said first insulating film.

4. A semiconductor device comprising:

a semiconductor substrate;

a memory cell transistor having first and second regions selectively formed in said semiconductor substrate;

a peripheral transistor having a third region selectively formed in said semiconductor substrate;

first, second and third silicide layers formed at respective surface portions of said first, second and third regions;

a first insulating layer covering said semiconductor substrate and said first, second and third suicide layers, said first insulating layer having first, second and third holes that expose respective parts of said first, second and third silicide layers;

a first conductive plug filling said first hole in contact with said first silicide layer, said first conductive plug being made of a metal;

a second conductive plug filling said second hole in contact with said second silicide layer, said second conductive plug being made of a metal;

a third conductive plug filling said third hole in contact with said third suicide layer, said third conductive plug being made of a metal;

a second insulating layer covering said first insulating layer arid said first, second and third conductive plugs;

said second insulating layer having a fourth hole that exposes a part of said first conductive plug;

a bit line formed on said second insulating layer, said bit line being in electrical contact with said first conductive plug through said fourth hole;

a third insulating layer covering said bit line and said second insulating layer;

a fifth hole formed to penetrate said third and second insulating layers to expose at least one part of said second conductive plug;

a fourth conductive plug filling said fifth hole in contact with said second conductive plug, said fourth conductive plug being made of a metal;

a capacitor formed on said third insulating layer; said capacitor having a lower electrode made of a metal and formed in contact with said fourth conductive plug, an upper electrode made of a metal and a dielectric layer sandwiched between said lower and upper electrodes;

a fourth insulating layer covering said capacitor and said third insulating layer;

a sixth hole formed to penetrate said second, third and fourth insulating layers to expose at least one part of said third conductive plug;

a fifth conductive plug filling said sixth hole in contact with said third conductive plug, said fifth conductive plug being made of a metal; and a wiring layer formed on said fourth insulating layer in contact with said fifth conductive plug, wherein said fifth conductive plug is divided into sixth and seventh conductive plugs, said sixth conductive plug being embedded into said second and third insulating layers, and said seventh conductive plug being embedded into said fourth insulating layer, and wherein said sixth conductive plug is substantially the same in height as said fourth conductive plug.

5. The device as claimed in claim 4, wherein lower ends of said fourth conductive plug and said sixth conductive plug substantially coincide with a lower surface of said second insulating layer, and upper ends of said fourth conductive plug and sixth conductive plug substantially coincide with an upper surface of said third insulating layer.

6. The device as claimed in claim 4, wherein said third conductive plug is substantially the same in height as said second conductive plug, and wherein upper ends of said second conductive plug and said third conductive plug substantially coincide with an upper surface of said first insulating layer.

* * * * *